US 8,275,956 B2

(12) United States Patent
Warnes et al.

(10) Patent No.: US 8,275,956 B2
(45) Date of Patent: *Sep. 25, 2012

(54) PARALLEL MEMORY DEVICE RANK SELECTION

(75) Inventors: Lidia Warnes, Roseville, CA (US); Teddy Lee, Roseville, CA (US); Ricardo Ernesto Espinoza-Ibarra, San Diego, CA (US); Dennis Carr, Roseville, CA (US); Michael Bozich Calhoun, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/168,455

(22) Filed: Jun. 24, 2011

(65) Prior Publication Data

US 2011/0258400 A1  Oct. 20, 2011

Related U.S. Application Data

(62) Division of application No. 11/796,903, filed on Apr. 30, 2007, now Pat. No. 7,996,602.

(51) Int. Cl.
*G06F 12/00* (2006.01)
*G06F 13/00* (2006.01)
*G06F 13/28* (2006.01)

(52) U.S. Cl. .................. 711/154; 711/167; 711/E12.001
(58) Field of Classification Search .................. 711/105, 711/167
See application file for complete search history.

(56) References Cited

U.S. PATENT DOCUMENTS

| | | | | |
|---|---|---|---|---|
| 7,739,441 | B1 * | 6/2010 | Lee et al. ........................ | 710/315 |
| 8,081,536 | B1 * | 12/2011 | Solomon et al. .......... | 365/230.06 |
| 2006/0146629 | A1 * | 7/2006 | Lee ................ | 365/222 |
| 2008/0091888 | A1 * | 4/2008 | Sandy ........................ | 711/154 |
| 2008/0133797 | A1 * | 6/2008 | Gower et al. ................... | 710/52 |
| 2008/0170425 | A1 * | 7/2008 | Rajan .............................. | 365/63 |
| 2008/0222367 | A1 * | 9/2008 | Co ................ | 711/149 |
| 2008/0256281 | A1 * | 10/2008 | Fahr et al. .................... | 710/305 |
| 2008/0266777 | A1 * | 10/2008 | Goldstein et al. ............. | 361/684 |
| 2008/0266993 | A1 * | 10/2008 | Goldsteln et al. ............. | 365/223 |
| 2012/0042204 | A1 * | 2/2012 | Smith et al. .................. | 714/6.32 |
| 2012/0084974 | A1 * | 4/2012 | Goldstein et al. .............. | 29/825 |

OTHER PUBLICATIONS

JEDEC Standard, FBDIMM: Architecture and Protocol, JEDEC Solid State Technology Association, 2007, pp. 1-18.*

* cited by examiner

*Primary Examiner* — Sheng-Jen Tsai

(57) ABSTRACT

A translator circuit translates a memory access conforming to a native FB-DIMM (Fully Buffered Dual In-Line Memory Module) protocol to a memory access for addressing more than two ranks of parallel memory devices. The parallel memory devices are distributed among plural non-fully-buffered DIMMs (Dual In-Line Memory Modules).

10 Claims, 11 Drawing Sheets

PARALLEL MEMORY DEVICE RANK SELECTION

This is a divisional of allowed U.S. patent application Ser. No. 11/796,903 filed Apr. 30, 2007, now U.S. Pat. No. 7,996,602, issued Aug. 9, 2011.

BACKGROUND

DIMM (dual in-line memory module) technology has random access memory (RAM) integrated circuits (ICs) mounted on a printed circuit board (PCB). Various types of DIMMs exist. DDR SDRAM (Double Data Rate Synchronous Dynamic Random Access Memory) DIMM technology has a parallel external interface. Fully buffered DIMM or FB-DIMM technology has a serial external interface.

FB-DIMM technology employs an Advanced Memory Buffer (AMB) having a serial connection to a memory controller, and a parallel connection to dynamic random access memory (DRAM). The AMB on each FB-DIMM translates the communication in serial point-to-point link protocol received from the memory host controller to DDR2 or DDR3 SDRAM parallel protocol transmitted to the DRAMs as read, write, refresh, etc. operations within the DIMM.

FB-DIMM architecture uses a southbound (SB) high speed link to send command and data information from the memory host controller to the AMB on each FB-DIMM and a northbound (NB) high speed link to transfer data from the AMBs on the FB-DIMMs to the memory host controller. The AMBs transfer read/write command and data to the DRAMs on each FB-DIMM. The high speed serial link interface between the memory host controller and the FB-DIMMs employs frames having cyclic redundancy check (CRC) with the data to transfer the data. The interface between each AMB and the DRAMs uses the DDR2 or DDR3 SDRAM parallel protocol to transfer data, address, and control.

DESCRIPTION OF THE DRAWINGS

Features of exemplary implementations of the invention will become apparent from the description, the claims, and the accompanying drawings in which:

DETAILED DESCRIPTION

Figure 1:
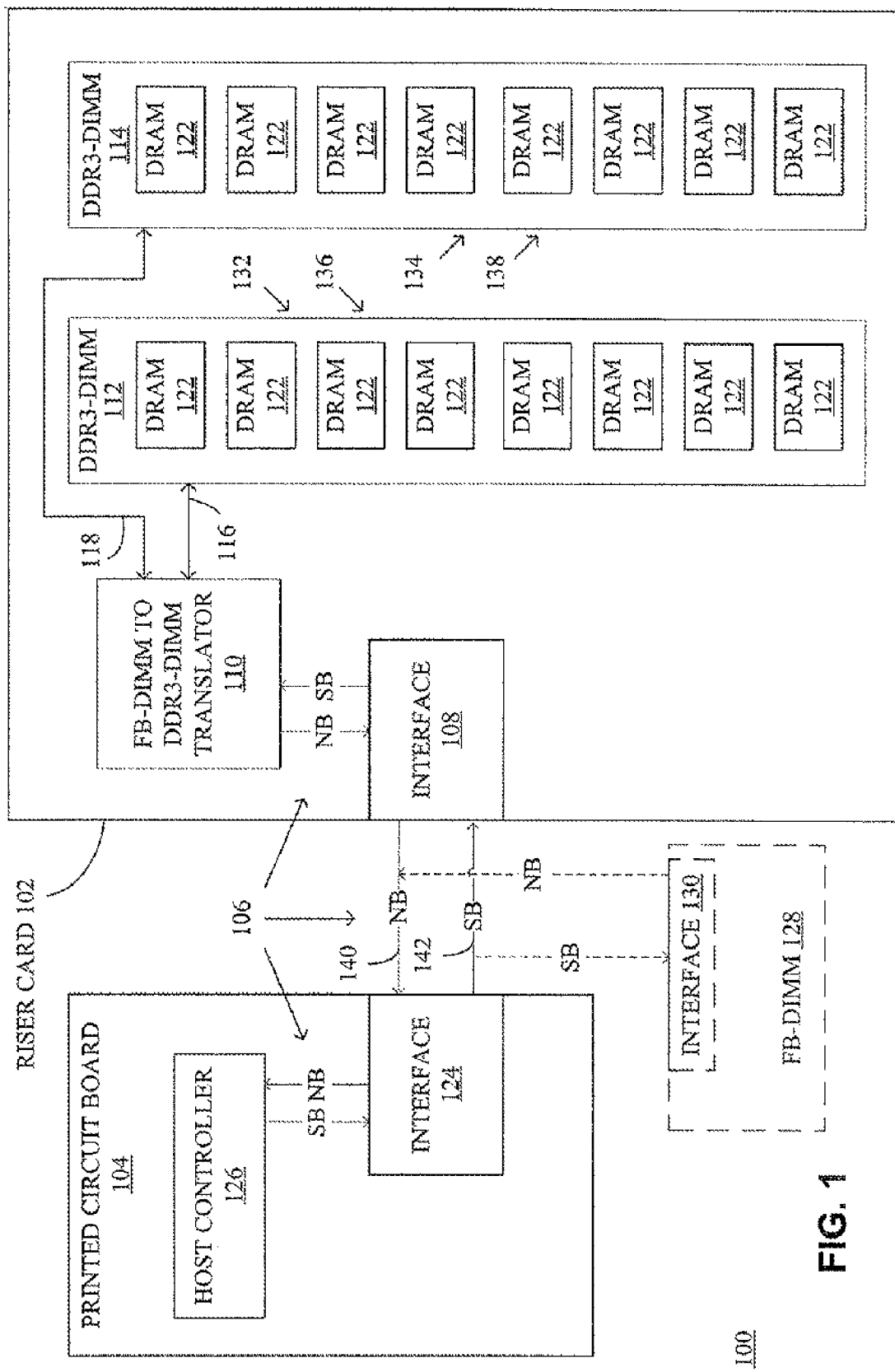
FIG. 1 is a representation of an implementation of an apparatus that comprises one or more riser boards and/or cards, a system board and/or printed circuit board (PCB), one or more serial protocol busses, one or more parallel protocol memory modules, and one or more parallel protocol busses.

Referring to the Background section above, if one does not want to modify the memory host controller interface but wants to reduce the number of AMBs in the system in an example one may install an exemplary translator on the PCB or a riser card. An exemplary translator serves to communicate with the memory host controller on the SB and NB high speed serial interface and drive up to sixteen (16) ranks through a DDR-DIMM interface. An exemplary rank comprises all the DRAM devices that can be selected by a select signal. An exemplary select signal comprises a chip select signal. The DDR-DIMM interface of the translator in an example may be connected to industry standard registered and/or unbuffered DDR-DIMMs that do not employ AMBs. The DDR-DIMM interface of the translator in an example may support one or two DDR channels. An exemplary channel comprises all the DDR-DIMMs that are connected to a DDR data bus.

Current FB-DIMM technology employs an expensive and power-hungry AMB device on each FB-DIMM installed in the system. The current FB-DIMM protocol allows for a maximum per FB-DIMM channel of eight (8) DDR DIMMs that each comprises two (2) ranks of DRAM devices. Under the current FB-DIMM protocol, each FB-DIMM comprises an AMB that can select a maximum of two (2) ranks of DRAM devices. The AMB increases the cost of the FB-DIMM. The AMB consumes a relatively large amount of power, making the power and cooling of the system more expensive and/or difficult in using the FB-DIMM technology.

An exemplary employment of an FB-DIMM protocol to DDR translator serves to address the maximum number of ranks allowed by the FB-DIMM protocol, for example, with just one FB-DIMM protocol to DDR translator serving to drive the eight (8) DDR DIMMs, reducing the system cost, and/or simplifying, enhancing, and/or reducing requirements for power and/or cooling.

An exemplary implementation omits the AMBs and instead employs a single FB-DIMM protocol to DDR translator to select up to, for example, sixteen (16) ranks. The translator in an example is installed on the PCB or a riser card. An exemplary implementation accommodates and/or employs a standard FB-DIMM high-speed interface while increasing bandwidth and capacity of a memory subsystem.

An exemplary implementation serves to select DDR-DIMMs for one or more DDR channels. The FB-DIMM protocol provides for three (3) FB-DIMM select bits (binary digits) DS0 to DS2 and a rank select bit RS. An existing memory host controller drives these bits to select one of the eight (8) two (2) rank FB-DIMMs that may be installed in an FB-DIMM channel. Instead of the previous employment of the bits to select FB-DIMMs, an exemplary translator may employ the bits to select ranks on registered and/or unbuffered DDR-DIMMs that do not employ AMBs.

FB-DIMMs are based on serial data transfer technology while DDR3 SDRAM DIMMs are based on parallel data transfer technology. An exemplary implementation allows both different memory technologies to be used in a same package. Full memory speed for both FB-DIMMs and DDR3 SDRAM DIMMs in an example is achievable.

An exemplary translator comprises a translator riser card or board. The riser card or board in an example comprises a circuit card or board that connects directly to the PCB and allows addition of cards to the PCB by connection through the riser card. Another exemplary implementation omits the riser card and locates the translator in the PCB.

In an exemplary implementation, a total number of DDR DIMM connectors on the riser card outside the PCB can be the same as a total number of FB-DIMM connectors on the PCB. An exemplary approach allows a user to choose between serial and parallel memory technologies without loss in a total quantity of DDR DIMM modules and FBDIMM modules allowable in the system regardless of the memory technology the user and/or customer chooses to use.

An exemplary approach allows employment of an existing standard such as FB-DIMM protocol and an existing memory controller design. An exemplary translator allows employment of parallel protocol DIMMs instead of the expensive, power hungry serial protocol FB-DIMMs. An exemplary implementation architects a select operation of the translator, for example, an IC and/or chip select operation.

Turning to FIGS. 1-4, an implementation of an apparatus 100 in an example comprises one or more riser boards and/or cards 102, a system board and/or printed circuit board (PCB) 104, one or more serial protocol busses 106, one or more parallel protocol memory modules 112, 114, 602 (FIG. 6), 604 (FIG. 6), 802 (FIG. 8), 804 (FIG. 8), 806 (FIG. 8), 808 (FIG. 8), and one or more parallel protocol busses 116, 118. The serial protocol bus 106 in an example comprises a high speed serial bus. Exemplary implementations of the serial protocol bus 106 comprise industry standard high speed serial busses such as FBD (fully buffered DIMM; FB-DIMM), PCI-express (PCIe), and HTx (hyper-transport) busses. One or more exemplary implementations employ plural rank parallel memory modules, such as two-rank and/or four-rank parallel memory modules, as one or more of the parallel protocol memory modules 112, 114, 602, 604, 802, 804, 806, 808. An exemplary rank comprises all the parallel memory devices 122 that can be selected by an individual select signal.

An exemplary implementation employs an exemplary logical association and/or assignment in connection with the parallel protocol memory modules such as parallel protocol memory module 112 corresponds to logic value zero (0), parallel protocol memory module 114 corresponds to logic value one (1), parallel protocol memory module 602 (FIG. 6) corresponds to logic value two (2), parallel protocol memory module 604 (FIG. 6) corresponds to logic value three (3), parallel protocol memory module 802 (FIG. 8) corresponds to logic value four (4), parallel protocol memory module 804 (FIG. 8) corresponds to logic value five (5), parallel protocol memory module 806 (FIG. 8) corresponds to logic value six (6), and parallel protocol memory module 808 (FIG. 8) corresponds to logic value seven (7).

Figure 5:
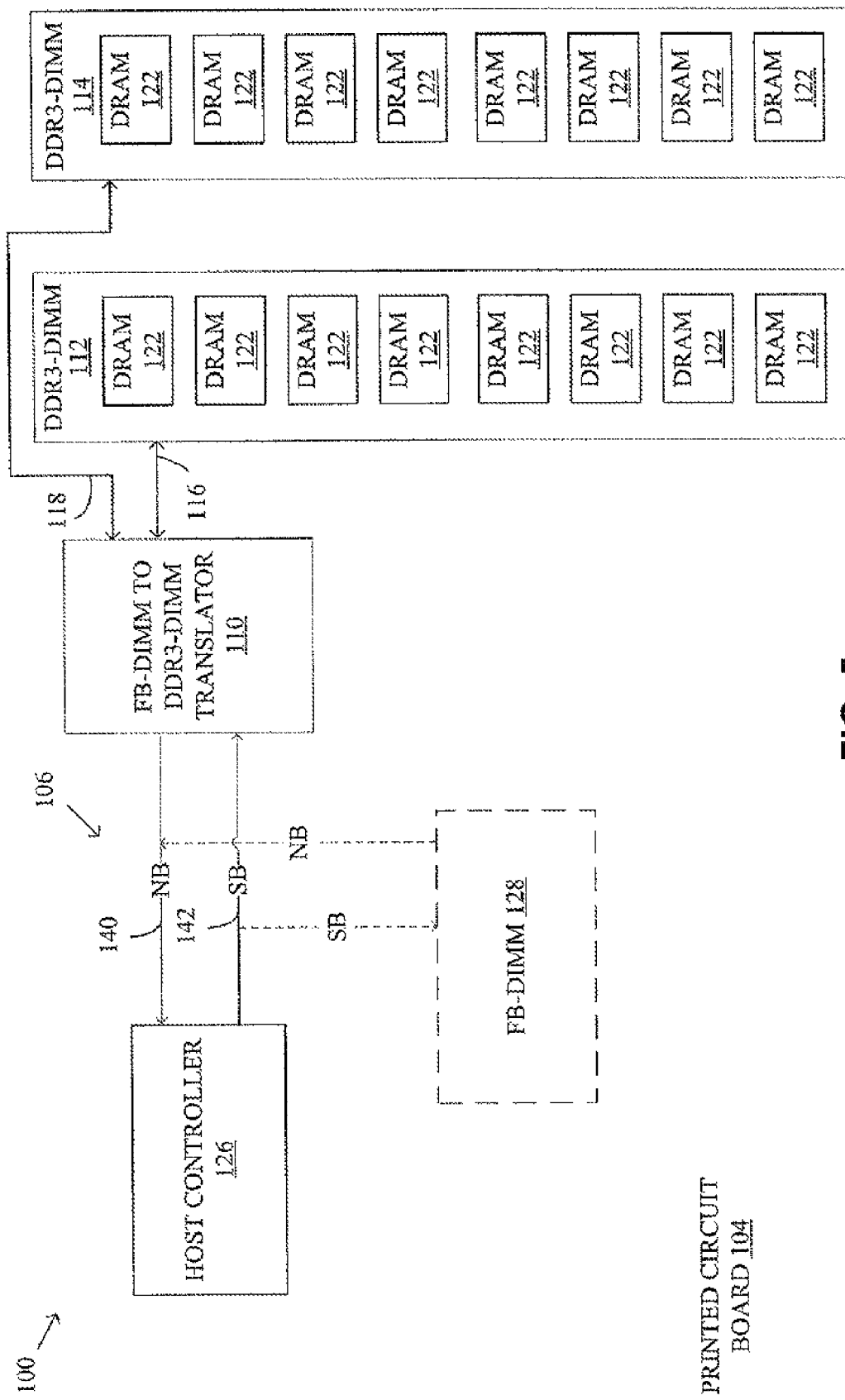
FIG. 5 is another implementation of the apparatus of FIG. 1 that comprises the PCB, one or more serial protocol busses, one or more parallel protocol memory modules, and one or more parallel protocol busses.

Turning to FIG. 5, another implementation of the apparatus 100 in an example comprises the PCB 104, one or more serial protocol busses 106, one or more parallel protocol memory modules 112, 114, 602 (FIG. 6), 604 (FIG. 6), 802 (FIG. 8), 804 (FIG. 8), 806 (FIG. 8), 808 (FIG. 8), and one or more parallel protocol busses 116, 118.

Figure 4:
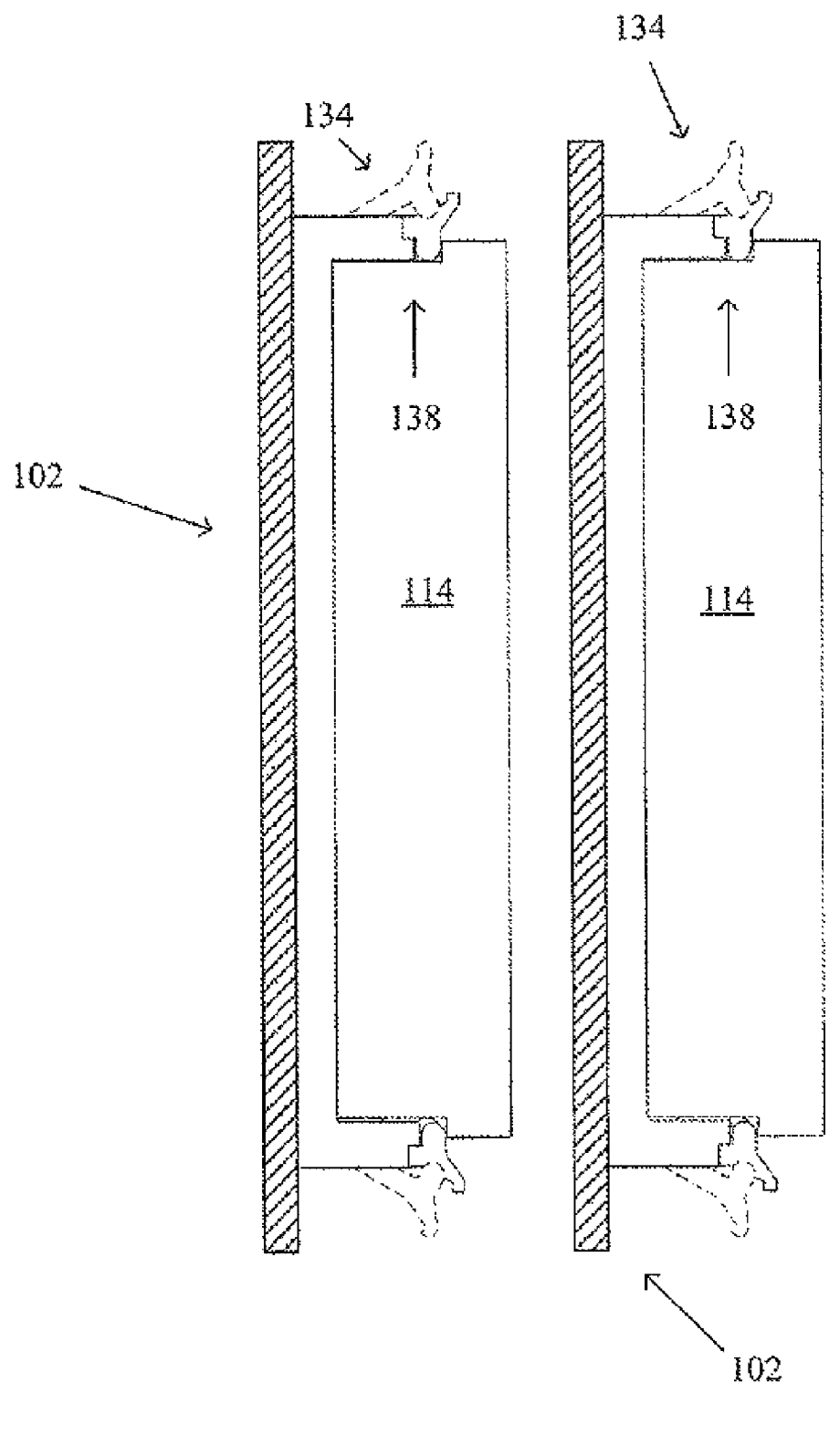
FIG. 4 is a top, partial representation of two riser cards and two parallel protocol memory modules of the implementation of the apparatus of FIG. 3.
Figure 6:
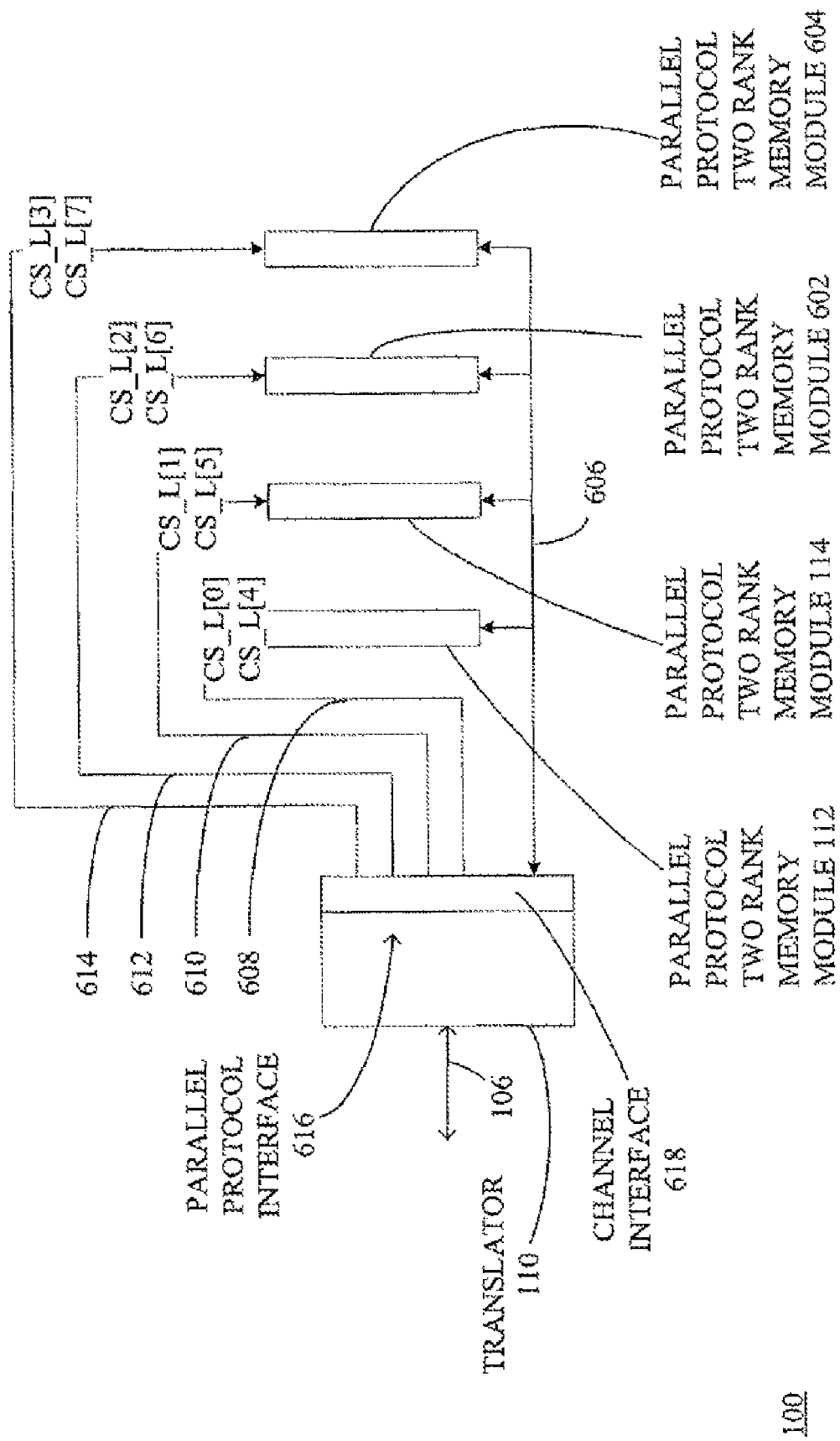
FIG. 6 is a representation of a translator and four parallel protocol memory modules of an implementation of the apparatus of FIG. 1, and illustrates one exemplary channel interface of the translator.

Referring to FIG. 1, the riser card 102 in an example comprises a serial protocol interface 108, a translator 110, and one or more parallel protocol connectors and/or interfaces 132, 134 (FIGS. 1 and 4). As discussed herein with reference to FIG. 2, the riser card 102 in an example optionally comprises a connector 202 and/or one or more voltage regulator modules 204. The translator 110 in an example comprises an exemplary implementation of an algorithm, procedure, program, process, mechanism, engine, model, coordinator, module, application, code, and/or logic. The translator 110 in an example comprises a parallel protocol interface 616 (FIG. 6). An exemplary parallel protocol interface 616 comprises one or more channel interfaces 618 (FIG. 6), 704 (FIG. 7), 902 (FIG. 9), 1004 (FIG. 10).

Figure 8:
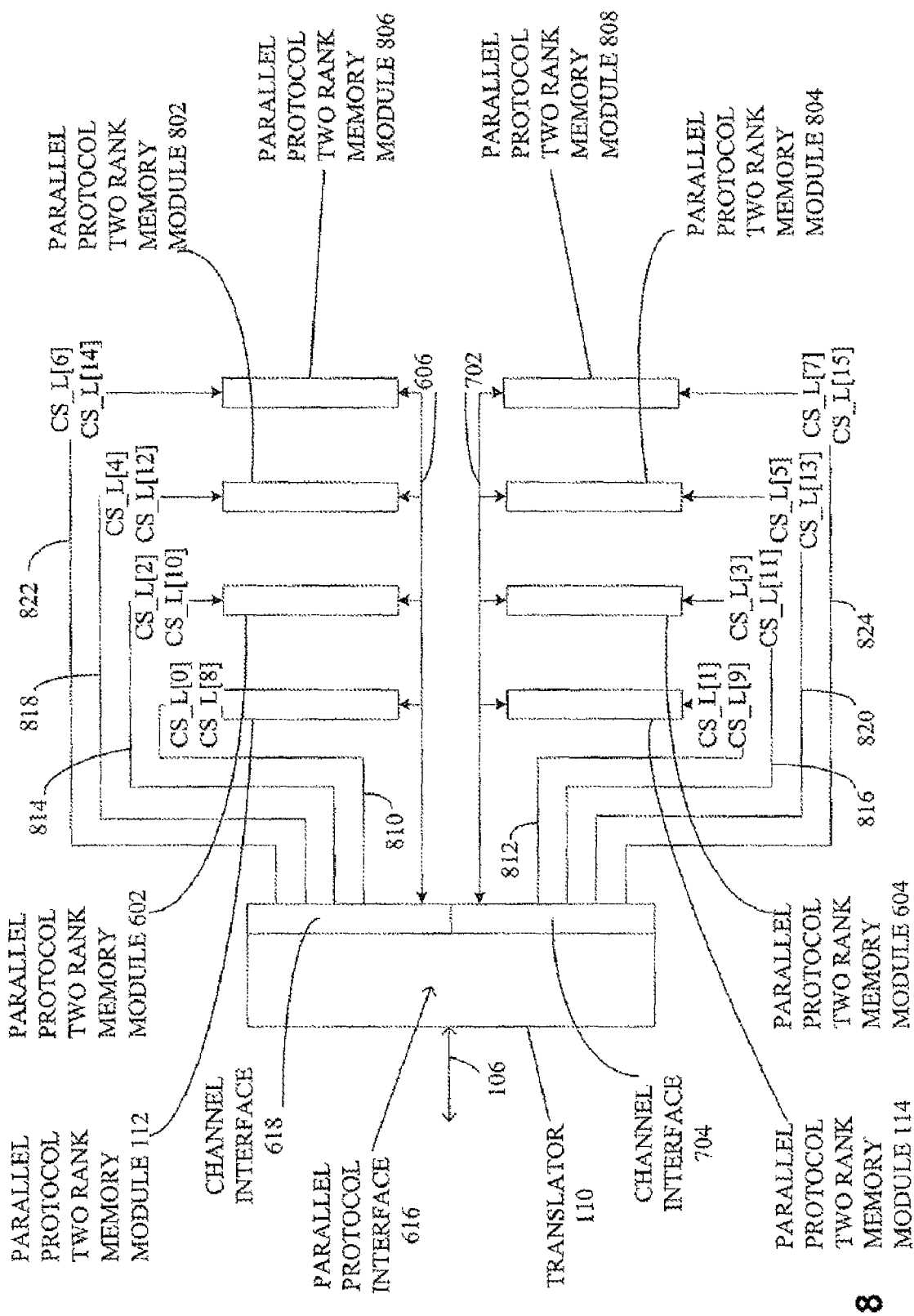
FIG. 8 is a representation of a translator and eight parallel protocol memory modules of an implementation of the apparatus of FIG. 1, and illustrates two exemplary channel interfaces of the translator.

The parallel protocol memory modules 112, 114, 602 (FIG. 6), 604 (FIG. 6), 802 (FIG. 8), 804 (FIG. 8), 806 (FIG. 8), 808 (FIG. 8) in an example comprise respective parallel protocol connectors and/or interfaces 136, 138 (FIGS. 1 and 4) and a plurality of parallel memory devices 122. For example, the parallel protocol memory module 112, 114, 602 (FIG. 6), 604 (FIG. 6), 802 (FIG. 8), 804 (FIG. 8), 806 (FIG. 8), 808 (FIG. 8) comprises eight, nine, eighteen parallel, and/or any selected and/or desired number of memory devices 122. Exemplary numbers of instances of the parallel protocol memory modules 112, 114, 602 (FIG. 6), 604 (FIG. 6), 802 (FIG. 8), 804 (FIG. 8), 806 (FIG. 8), 808 (FIG. 8) on an exemplary riser card 102 comprise any selected and/or desirable number, for example, two, four, eight, or sixteen parallel protocol memory modules 112, 114, 602 (FIG. 6), 604 (FIG. 6), 802 (FIG. 8), 804 (FIG. 8), 806 (FIG. 8), 808 (FIG. 8). For explanatory purposes, FIGS. 1-5 illustrate an exemplary implementation that comprises two parallel protocol memory modules 112, 114 on each riser card 102. As will be appreciated by those skilled in the art, an exemplary riser card 102 comprises more than two parallel protocol memory modules 112, 114, 602 (FIG. 6), 604 (FIG. 6), 802 (FIG. 8), 804 (FIG. 8), 806 (FIG. 8), 808 (FIG. 8). Exemplary parallel protocol memory modules 112, 114, 602 (FIG. 6), 604 (FIG. 6), 802 (FIG. 8), 804 (FIG. 8), 806 (FIG. 8), 808 (FIG. 8) comprise registered and/or unbuffered DIMMs, for example DDR3 DIMMs. An exemplary parallel memory device 122 comprises a dynamic random access memory (DRAM). The riser card 102 and the parallel protocol memory modules 112, 114, 602 (FIG. 6), 604 (FIG. 6), 802 (FIG. 8), 804 (FIG. 8), 806 (FIG. 8), 808 (FIG. 8) in an example serve to take a place of, substitute for, and/or provide an upgrade from a serial protocol memory module 128 such as a fully buffered dual in-line memory module (FB-DIMM, FBDIMM, and/or FBD). The serial protocol memory module 128 in an example comprises an interface 130, for example, that comprises an Advanced Memory Buffer (AMB).

Referring to FIG. 5, the translator 110, the parallel protocol memory modules 112, 114, 602 (FIG. 6), 604 (FIG. 6), 802 (FIG. 8), 804 (FIG. 8), 806 (FIG. 8), 808 (FIG. 8), and the one or more parallel protocol busses 116, 118 in an example serve to take a place of and/or substitute for the serial protocol memory module 128.

Referring to FIG. 1, the PCB 104 in an example comprises a serial protocol interface 124 and a memory controller and/or host controller 126. The serial protocol interfaces 108, 124, 130 in an example comprise FB-DIMM memory module connectors (FB-DIMM connectors). An exemplary FB-DIMM memory module connector as the serial protocol interface 108, 130 in an example comprises two hundred forty (240) pins and/or fingers that comply with standards of the JEDEC Solid State Technology Association (previously known as the Joint Electron Device Engineering Council; World Wide Web jedec.org).

The pins of an exemplary interface 108 are vertical and/or orthogonal. The pins of another exemplary interface 108 are angled and/or oblique. The serial protocol interface 108 in an example comprises gold pins that fit directly into an FB-DIMM memory module connector and/or FB-DIMM connector as the parallel protocol interface 124. An exemplary the FB-DIMM memory module connector as the serial protocol interface 124 comprises slots and/or holes that receive, engage, mesh, couple, connect, and/or mate with pins as an exemplary interface 108. The riser card 102 in an example fits directly into the FB-DIMM connector as the serial protocol interface 124. An edge of the riser card 102 in an example comprises gold fingers and/or pins that allow the riser card 102 to plug directly into the FB-DIMM memory module connector as the serial protocol interface 124. As discussed herein with reference to FIG. 2, the riser card 102 in an example comprises notches 206, 208 at both ends to allow the riser card 102 to be accommodated by end latches 308 (FIG. 3), for example, of a standard FB-DIMM memory module connector as an exemplary interface 124.

The bus 106 as an FB-DIMM bus in an example comprises a northbound (NB) path 140 and a southbound (SB) path 142. An exemplary northbound path 140 comprises fourteen (14) bit (binary digit) lanes carrying data from memory such as the parallel protocol memory module 112, 114, 602 (FIG. 6), 604 (FIG. 6), 802 (FIG. 8), 804 (FIG. 8), 806 (FIG. 8), 808 (FIG. 8) to a processor such as the host controller 126. An exemplary southbound path 142 comprises ten (10) southbound (SB) bit lanes carrying commands and data from the processor such as the host controller 126 to memory such as the parallel protocol memory module 112, 114, 602 (FIG. 6), 604 (FIG. 6), 802 (FIG. 8), 804 (FIG. 8), 806 (FIG. 8), 808 (FIG. 8).

An exemplary parallel protocol bus 116, 118 comprises a Double Data Rate (DDR) bus, for example, a DDR3 bus. The parallel protocol busses 116, 118 in an example comprise one or more data and/or strobe busses and one or more control and/or command busses, for example, data busses 606 (FIG. 6), 702 (FIG. 7), 904 (FIG. 9), 1002 (FIG. 10) and control busses 608 (FIG. 6), 610 (FIG. 6), 612 (FIG. 6), 614 (FIG. 6), 706 (FIG. 7), 708 (FIG. 7), 710 (FIG. 7), 712 (FIG. 7), 810 (FIG. 8), 812 (FIG. 8), 814 (FIG. 8), 816 (FIG. 8), 818 (FIG. 8), 820 (FIG. 8), 822 (FIG. 8), 824 (FIG. 8), 906 (FIG. 9), 908 (FIG. 9), 910 (FIG. 9), 912 (FIG. 9), 914 (FIG. 9), 916 (FIG. 9), 1006 (FIG. 10), 1008 (FIG. 10), 1010 (FIG. 10), 1012 (FIG. 10), 1014 (FIG. 10), 1016 (FIG. 10), 1018 (FIG. 10), 1020 (FIG. 10).

To allow employment of one or more DDR3 DIMMs as one or more parallel protocol memory modules 112, 114, 602 (FIG. 6), 604 (FIG. 6), 802 (FIG. 8), 804 (FIG. 8), 806 (FIG. 8), 808 (FIG. 8) on a computer system and/or PCB 104 with an existing FB-DIMM connector as the serial protocol interface 124 in an example a user need only plug in riser card 102 into the FB-DIMM connector as the serial protocol interface 124 and install DDR3 SDRAM (Synchronous Dynamic Random Access Memory) DIMMs as the parallel protocol memory modules 112, 114, 602 (FIG. 6), 604 (FIG. 6), 802 (FIG. 8), 804 (FIG. 8), 806 (FIG. 8), 808 (FIG. 8) at parallel protocol interface 132, 134 on the riser card 102. For example, to allow employment of one or more DDR3 DIMMs as one or more parallel protocol memory modules 112, 114, 602 (FIG. 6), 604 (FIG. 6), 802 (FIG. 8), 804 (FIG. 8), 806 (FIG. 8), 808 (FIG. 8) in an example a user need only replace an FB-DIMM as the serial protocol memory module 128 with the riser card 102, and have the DDR3 SDRAM DIMMs as the parallel protocol memory modules 112, 114, 602 (FIG. 6), 604 (FIG. 6), 802 (FIG. 8), 804 (FIG. 8), 806 (FIG. 8), 808 (FIG. 8) coupled with the riser card 102. To allow employment of an FB-DIMM as the serial protocol memory module 128 in an example a user need only replace the riser card 102 with the FB-DIMM as the serial protocol memory module 128.

The FB-DIMM to DDR3 translator IC as the translator 110 in an example receives commands and write data from the host controller 126 and sends read data back to the host controller 126 using the FB-DIMM protocol as a serial memory protocol. The FB-DIMM to DDR3 translator IC as the translator 110 in an example translates the FB-DIMM protocol as the serial memory protocol to DDR protocol as a parallel memory protocol to send transfer commands and read/write data to the DDR3 DIMMs as the parallel protocol memory modules 112, 114, 602 (FIG. 6), 604 (FIG. 6), 802 (FIG. 8), 804 (FIG. 8), 806 (FIG. 8), 808 (FIG. 8). The translator 110 in an example drives one or more DDR busses as the one or more parallel protocol busses 116, 118.

Figure 2:
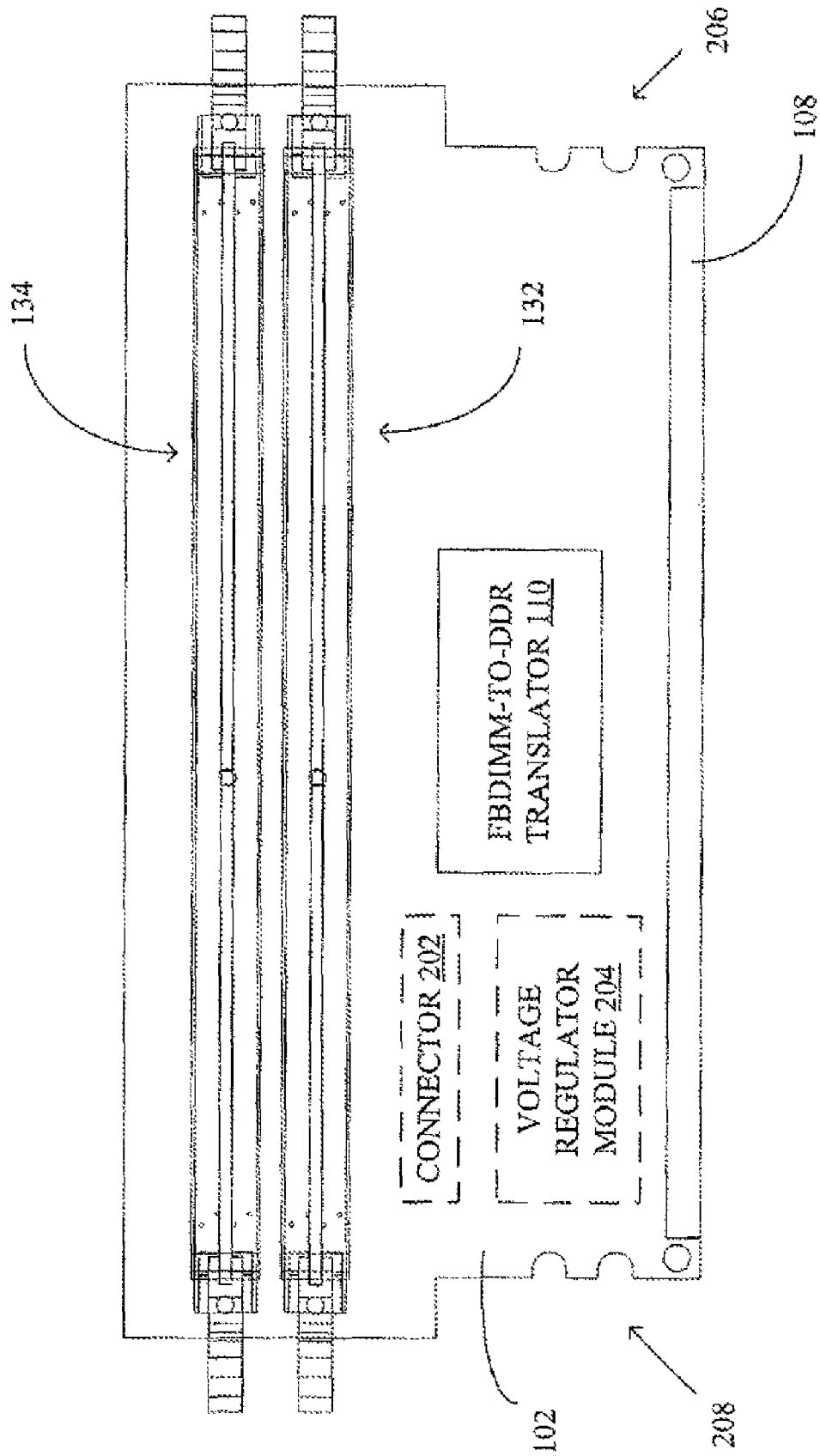
FIG. 2 is an enlarged, side representation of a riser card of an implementation of the apparatus of FIG. 1.

Turning to FIG. 2, the riser card 102 in an example comprises notches 206, 208 at both ends to allow the riser card 102 to be accommodated by end latches (not shown) of a standard FB-DIMM memory module connector as an exemplary interface 124. The riser card 102 in an example optionally comprises a connector 202 and/or a voltage regulator module 204. The connector 202 in an example receives and/or couples with a flying lead cable (not shown) to deliver additional power to the riser card 102, for example, to the voltage regulator module 204. An exemplary connector 202 is locatable at any desirable, selected, and/or convenient place on the riser card 102. The voltage regulator module 204 in an example is locatable on the card 102 such as to provide additional, extra, and/or sufficient power to the components onboard and/or connected with the riser card 102. An exemplary voltage regulator module 204 serves to generate component and/or bus voltages.

Figure 3:
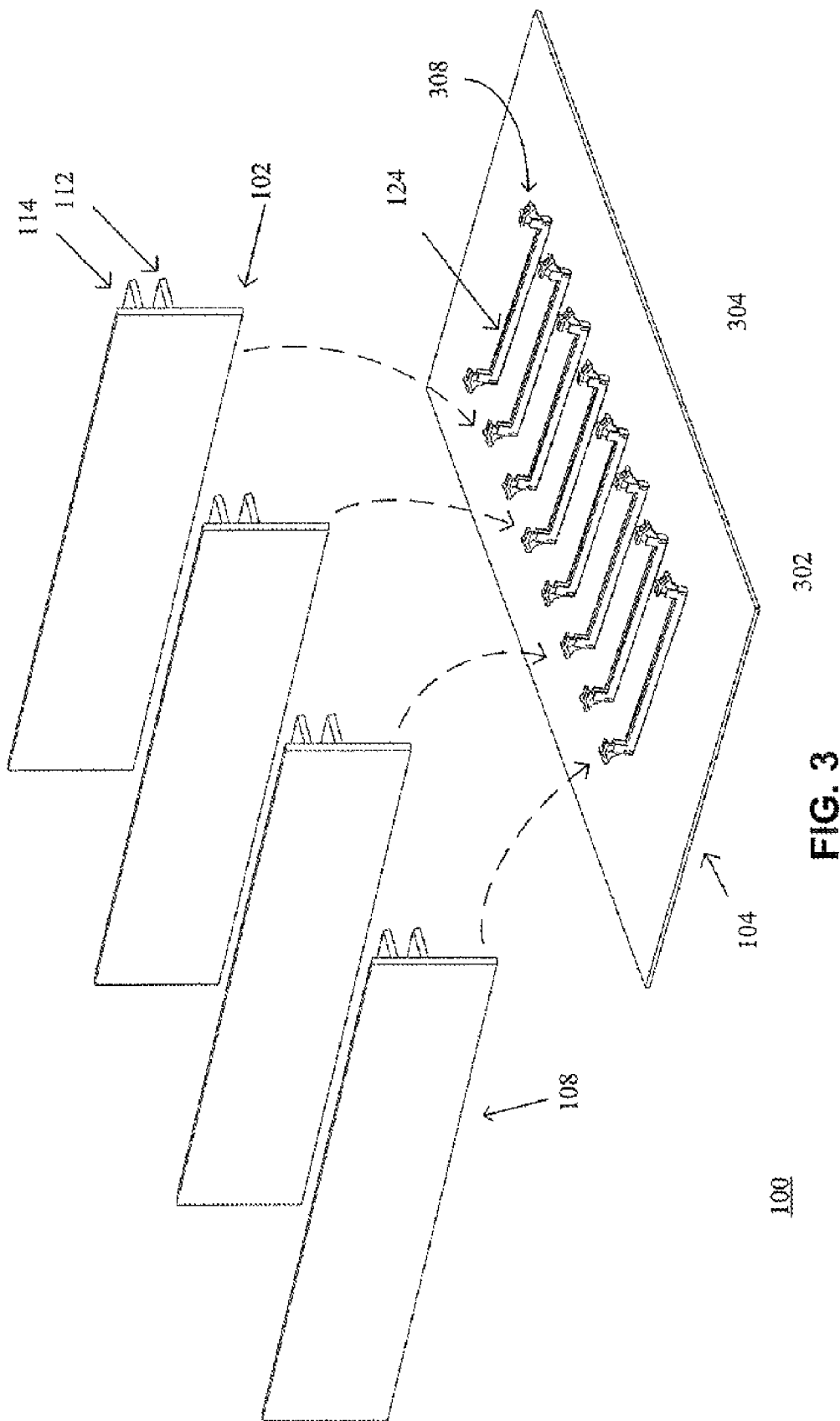
FIG. 3 is a perspective, cutaway, partial, exploded representation of a plurality of riser cards, a plurality of parallel protocol memory modules, and the PCB of an implementation of the apparatus of FIG. 1, and illustrates an exemplary vertical and/or orthogonal arrangement of the parallel protocol memory modules.

Turning to FIG. 3, the serial protocol interfaces 108 of a plurality of riser cards 102 in an example are inserted directly into a respective plurality of FB-DIMM connectors as the serial protocol interfaces 124 on the PCB 104. Referring to FIGS. 1, 3, and 4, DDR3 SDRAM memory as parallel protocol memory modules 112, 114, 602 (FIG. 6), 604 (FIG. 6), 802 (FIG. 8), 804 (FIG. 8), 806 (FIG. 8), 808 (FIG. 8) in an example have respective interfaces 136, 138 inserted on respective DDR3 DIMM connectors as the parallel protocol interfaces 132, 134 of the riser card 102. The PCB 102 in an example is embedded with FB-DIMM memory technology as a serial memory protocol implementation such as through employment of the host controller 126 and the serial protocol interface 124.

Referring to FIG. 4, an exemplary interface 132 comprises a latch that pivots into a holding gap as an exemplary interface 136. An exemplary latch as the interface 132 comprises a standard DIMM connector and/or socket latch. Referring to FIGS. 1 through 4, exemplary interfaces 132, 134, 136, 138 are vertical and/or orthogonal. An exemplary DDR-DIMM interface as the interface 132, 134, 136, 138 in an example comprises connection of two hundred forty (240) pins and/or fingers that comply with standards of the JEDEC Solid State Technology Association (previously known as the Joint Electron Device Engineering Council; World Wide Web jedec.org).

Turning to FIGS. 6-10, instead of a previous employment of DIMM select bits (binary digits) DS0 to DS2 and rank select bit RS under the FB-DIMM protocol, an exemplary translator 110 employs the bits to select ranks of parallel memory devices 122 in the parallel protocol memory modules 112, 114, 602 (FIG. 6), 604 (FIG. 6), 802 (FIG. 8), 804 (FIG. 8), 806 (FIG. 8), 808 (FIG. 8), for example, as registered and/or unbuffered DDR-DIMMs that do not employ AMBs. An exemplary rank comprises all the parallel memory devices 122 that can be selected by an individual select signal.

Referring to FIG. 6, an exemplary implementation employs two-rank parallel memory modules as the parallel protocol memory modules 112, 114, 602, 604. The parallel protocol interface 616 of the translator 110 in an example comprises one channel interface 618. The parallel protocol interface 616 in an example comprises only one DDR channel output for a maximum of eight (8) ranks on the DDR side. The parallel protocol interface 616 in an example accepts but does not actively employ the RS bit in selection of the ranks. The parallel protocol interface 616 in an example employs the DS0 bit as the LSB (least significant bit) DIMM select bit to select between the odd and even ranks. The translator 110 in an example interprets, applies, and/or employs the bits RS and DS0 to DS2 native to the FB-DIMM protocol to select corresponding ranks of parallel memory devices 122 in registered and/or unbuffered DIMMs as exemplary parallel protocol memory modules 112, 114, 602, 604 as follows:

| RS | DS2 | DS1 | DS0 | Chip Select Logic Value |
|----|-----|-----|-----|-------------------------|
| 0  | 0   | 0   | 0   | CS_L[0]                 |
| 0  | 0   | 0   | 1   | CS_L[1]                 |
| 0  | 0   | 1   | 0   | CS_L[2]                 |
| 0  | 0   | 1   | 1   | CS_L[3]                 |
| 0  | 1   | 0   | 0   | CS_L[4]                 |
| 0  | 1   | 0   | 1   | CS_L[5]                 |
| 0  | 1   | 1   | 0   | CS_L[6]                 |
| 0  | 1   | 1   | 1   | CS_L[7]                 |

The parallel protocol interface 616 of the translator 110 in an example applies particular Chip Select Logic Values zero (0) to seven (7) to the control busses 608, 610, 612, 614 to select the corresponding ranks of parallel memory devices 122 in the parallel protocol memory modules 112, 114, 602, 604. An exemplary implementation employs an exemplary logical association and/or assignment in connection with the parallel protocol memory modules such as parallel protocol memory module 112 corresponds to logic value zero (0), parallel protocol memory module 114 corresponds to logic value one (1), parallel protocol memory module 602 (FIG. 6) corresponds to logic value two (2), and parallel protocol memory module 604 (FIG. 6) corresponds to logic value three (3).

The channel interface 618 in an example applies Chip Select Logic Values zero (0) and four (4) to the control bus 608 to select the respective two ranks of parallel memory devices 122 in an exemplary parallel protocol memory module 112. The channel interface 618 in an example applies Chip Select Logic Values one (1) and five (5) to the control bus 610 to select the respective two ranks of parallel memory devices 122 in an exemplary parallel protocol memory module 114. The channel interface 618 in an example applies Chip Select Logic Values two (2) and six (6) to the control bus 612 to select the respective two ranks of parallel memory devices 122 in an exemplary parallel protocol memory module 602. The channel interface 618 in an example applies Chip Select Logic Values three (3) and seven (7) to the control bus 614 to select the respective two ranks of parallel memory devices 122 in an exemplary parallel protocol memory module 604.

Figure 7:
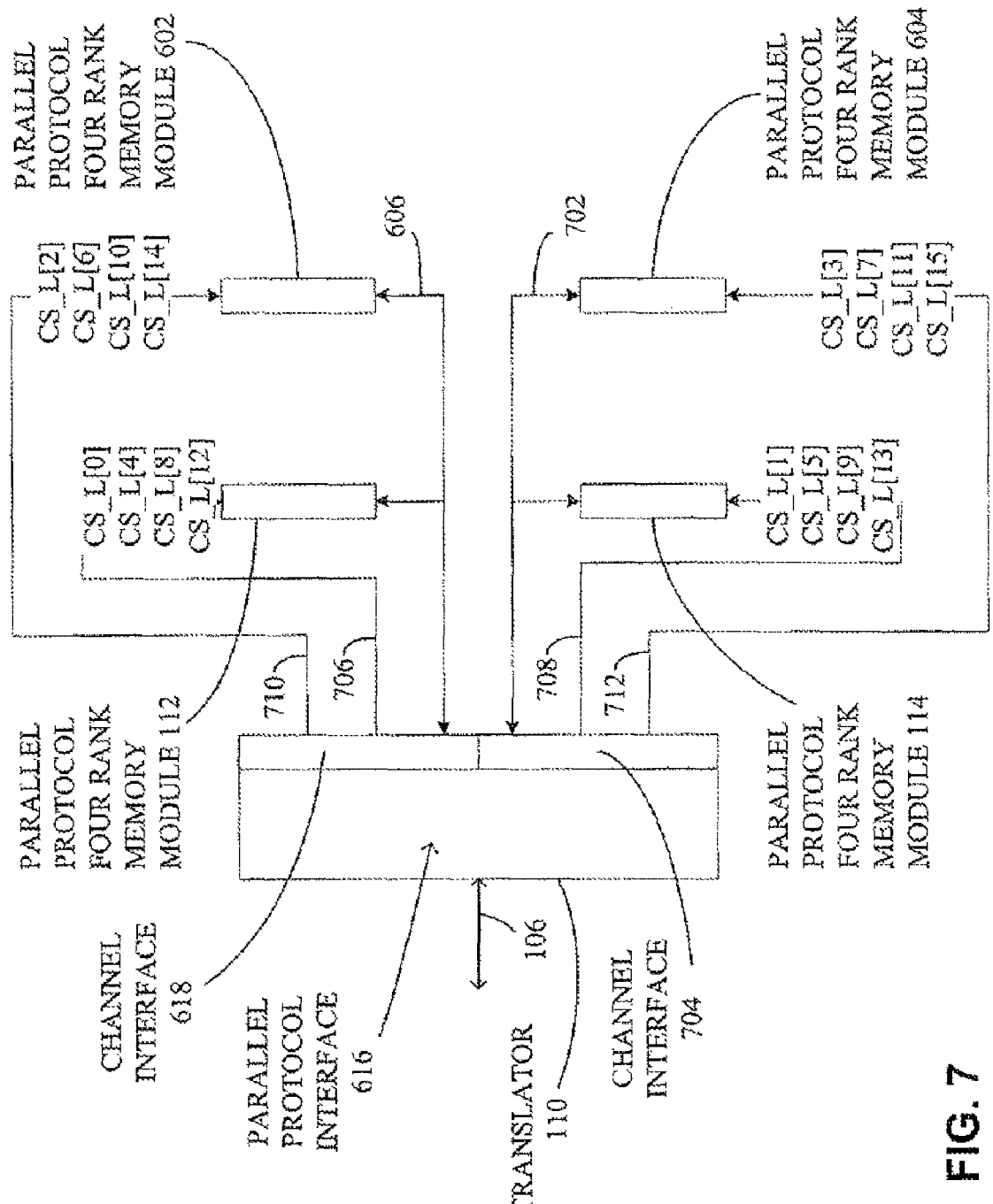
FIG. 7 is a representation of a translator and four parallel protocol memory modules of an implementation of the apparatus of FIG. 1, and illustrates two exemplary channel interfaces of the translator.

Referring to FIG. 7, an exemplary implementation employs four-rank parallel memory modules as the parallel protocol memory modules 112, 114, 602, 604. The parallel protocol interface 616 of the translator 110 in an example comprises two channel interfaces, for example, channel interface 618 and channel interface 704. The parallel protocol interface 616 in an example comprises two DDR channel outputs with eight (8) ranks on each channel for a maximum number of sixteen (16) ranks. The parallel protocol interface 616 in an example employs the DS0 bit as the LSB DIMM select bit to select between the two exemplary DIMM channels. The parallel protocol interface 616 in an example employs the RS bit along with the DS2 bit to select between ranks of parallel memory devices 122 on the same DIMM as an exemplary parallel protocol memory module 112, 114, 602, 604. The parallel protocol interface 616 in an example employs the DS0 bit to select between two DDR output channels from the two respective exemplary channel interface 618 and channel interface 704.

| RS | DS2 | DS1 | DS0 | Chip Select Logic Value |
|----|-----|-----|-----|-------------------------|
| 0  | 0   | 0   | 0   | CS_L[0]                 |
| 0  | 0   | 0   | 1   | CS_L[1]                 |
| 0  | 0   | 1   | 0   | CS_L[2]                 |
| 0  | 0   | 1   | 1   | CS_L[3]                 |
| 0  | 1   | 0   | 0   | CS_L[4]                 |
| 0  | 1   | 0   | 1   | CS_L[5]                 |
| 0  | 1   | 1   | 0   | CS_L[6]                 |
| 0  | 1   | 1   | 1   | CS_L[7]                 |
| 1  | 0   | 0   | 0   | CS_L[8]                 |
| 1  | 0   | 0   | 1   | CS_L[9]                 |
| 1  | 0   | 1   | 0   | CS_L[10]                |
| 1  | 0   | 1   | 1   | CS_L[11]                |
| 1  | 1   | 0   | 0   | CS_L[12]                |
| 1  | 1   | 0   | 1   | CS_L[13]                |
| 1  | 1   | 1   | 0   | CS_L[14]                |
| 1  | 1   | 1   | 1   | CS_L[15]                |

The parallel protocol interface 616 of the translator 110 in an example applies particular Chip Select Logic Values zero (0) to fifteen (15) to the control busses 706, 708, 710, 712 to select the corresponding ranks of parallel memory devices 122 in the parallel protocol memory modules 112, 114, 602, 604. An exemplary, implementation employs an exemplary logical association and/or assignment in connection with the parallel protocol memory modules such as parallel protocol memory module 112 corresponds to logic value zero (0), parallel protocol memory module 114 corresponds to logic value one (1), parallel protocol memory module 602 corresponds to logic value two (2), and parallel protocol memory module 604 corresponds to logic value three (3).

The channel interface 618 in an example applies Chip Select Logic Values zero (0), two (2), eight (8), and ten (10) to the control bus 706 to select the respective four ranks of parallel memory devices 122 in an exemplary parallel protocol memory module 112. The channel interface 704 in an example applies Chip Select Logic Values one (1), three (3), nine (9), and eleven (11) to the control bus 708 to select the respective four ranks of parallel memory devices 122 in an exemplary parallel protocol memory module 114. The channel interface 618 in an example applies Chip Select Logic Values four (4), six (6), twelve (12), and fourteen (14) to the control bus 710 to select the respective four ranks of parallel memory devices 122 in an exemplary parallel protocol memory module 602. The channel interface 704 in an example applies Chip Select Logic Values five (5), seven (7), thirteen (13), and fifteen (15) to the control bus 712 to select the respective four ranks of parallel memory devices 122 in an exemplary parallel protocol memory module 604.

Referring to FIG. 8, an exemplary implementation employs two-rank parallel memory modules as the parallel protocol memory modules 112, 114, 602, 604, 802, 804, 806, 808. The parallel protocol interface 616 of the translator 110 in an example comprises two channel interfaces, for example, channel interface 618 and channel interface 704. The parallel protocol interface 616 in an example comprises two DDR channel outputs with eight (8) ranks on each channel for a maximum number of sixteen (16) ranks. The parallel protocol interface 616 in an example employs the RS bit to select between two DDR output channels from the two respective exemplary channel interface 618 and channel interface 704.

| DS2 | DS1 | DS0 | RS | Chip Select Logic Value |
|---|---|---|---|---|
| 0 | 0 | 0 | 0 | CS_L[0] |
| 0 | 0 | 0 | 1 | CS_L[1] |
| 0 | 0 | 1 | 0 | CS_L[2] |
| 0 | 0 | 1 | 1 | CS_L[3] |
| 0 | 1 | 0 | 0 | CS_L[4] |
| 0 | 1 | 0 | 1 | CS_L[5] |
| 0 | 1 | 1 | 0 | CS_L[6] |
| 0 | 1 | 1 | 1 | CS_L[7] |
| 1 | 0 | 0 | 0 | CS_L[8] |
| 1 | 0 | 0 | 1 | CS_L[9] |
| 1 | 0 | 1 | 0 | CS_L[10] |
| 1 | 0 | 1 | 1 | CS_L[11] |
| 1 | 1 | 0 | 0 | CS_L[12] |
| 1 | 1 | 0 | 1 | CS_L[13] |
| 1 | 1 | 1 | 0 | CS_L[14] |
| 1 | 1 | 1 | 1 | CS_L[15] |

The parallel protocol interface 616 of the translator 110 in an example applies particular Chip Select Logic Values zero (0) to fifteen (15) to the control busses 810, 812, 814, 816, 818, 820, 822, 824 to select the corresponding ranks of parallel memory devices 122 in the parallel protocol memory modules 112, 114, 602, 604, 802, 804, 806, 808. An exemplary implementation employs an exemplary logical association and/or assignment in connection with the parallel protocol memory modules such as parallel protocol memory module 112 corresponds to logic value zero (0), parallel protocol memory module 114 corresponds to logic value one (1), parallel protocol memory module 602 corresponds to logic value two (2), parallel protocol memory module 604 corresponds to logic value three (3), parallel protocol memory module 802 corresponds to logic value four (4), parallel protocol memory module 804 corresponds to logic value five (5), parallel protocol memory module 806 corresponds to logic value six (6), and parallel protocol memory module 808 corresponds to logic value seven (7).

The channel interface 618 in an example applies Chip Select Logic Values zero (0) and eight (8) to the control bus 810 to select the respective two ranks of parallel memory devices 122 in an exemplary parallel protocol memory module 112. The channel interface 704 in an example applies Chip Select Logic Values one (1) and nine (9) to the control bus 812 to select the respective two ranks of parallel memory devices 122 in an exemplary parallel protocol memory module 114. The channel interface 618 in an example applies Chip Select Logic Values two (2) and ten (10) to the control bus 814 to select the respective two ranks of parallel memory devices 122 in an exemplary parallel protocol memory module 602. The channel interface 704 in an example applies Chip Select Logic Values three (3) and eleven (11) to the control bus 816 to select the respective two ranks of parallel memory devices 122 in an exemplary parallel protocol memory module 604. The channel interface 618 in an example applies Chip Select Logic Values four (4) and twelve (12) to the control bus 818 to select the respective two ranks of parallel memory devices 122 in an exemplary parallel protocol memory module 802. The channel interface 704 in an example applies Chip Select Logic Values five (5) and thirteen (13) to the control bus 820 to select the respective two ranks of parallel memory devices 122 in an exemplary parallel protocol memory module 804. The channel interface 618 in an example applies Chip Select Logic Values six (6) and fourteen (14) to the control bus 822 to select the respective two ranks of parallel memory devices 122 in an exemplary parallel protocol memory module 806. The channel interface 704 in an example applies Chip Select Logic Values seven (7) and fifteen (15) to the control bus 824 to select the respective two ranks of parallel memory devices 122 in an exemplary parallel protocol memory module 808.

Figure 9:
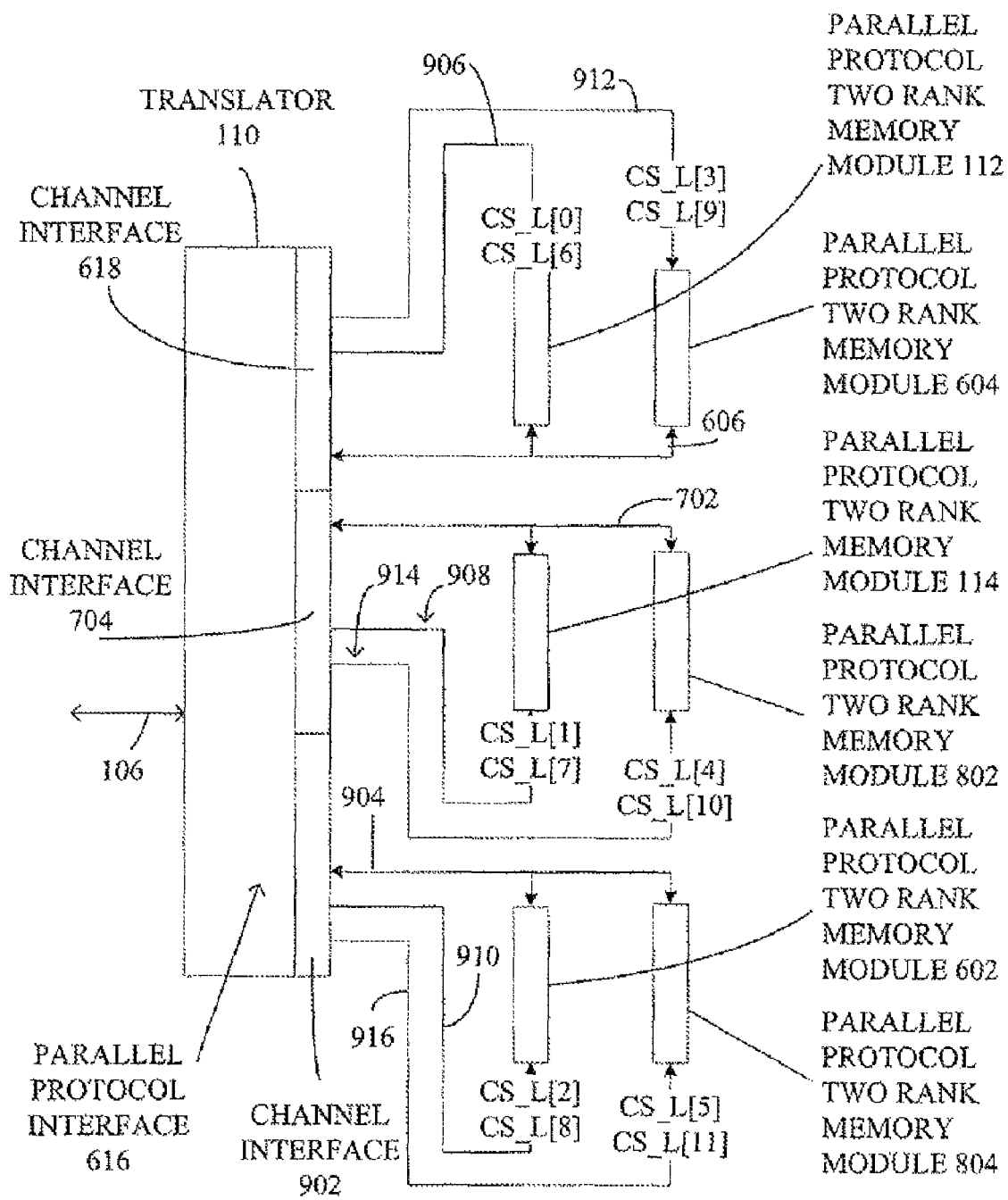
FIG. 9 is a representation of a translator and six parallel protocol memory modules of an implementation of the apparatus of FIG. 1, and illustrates three exemplary channel interfaces of the translator.
Figure 10:
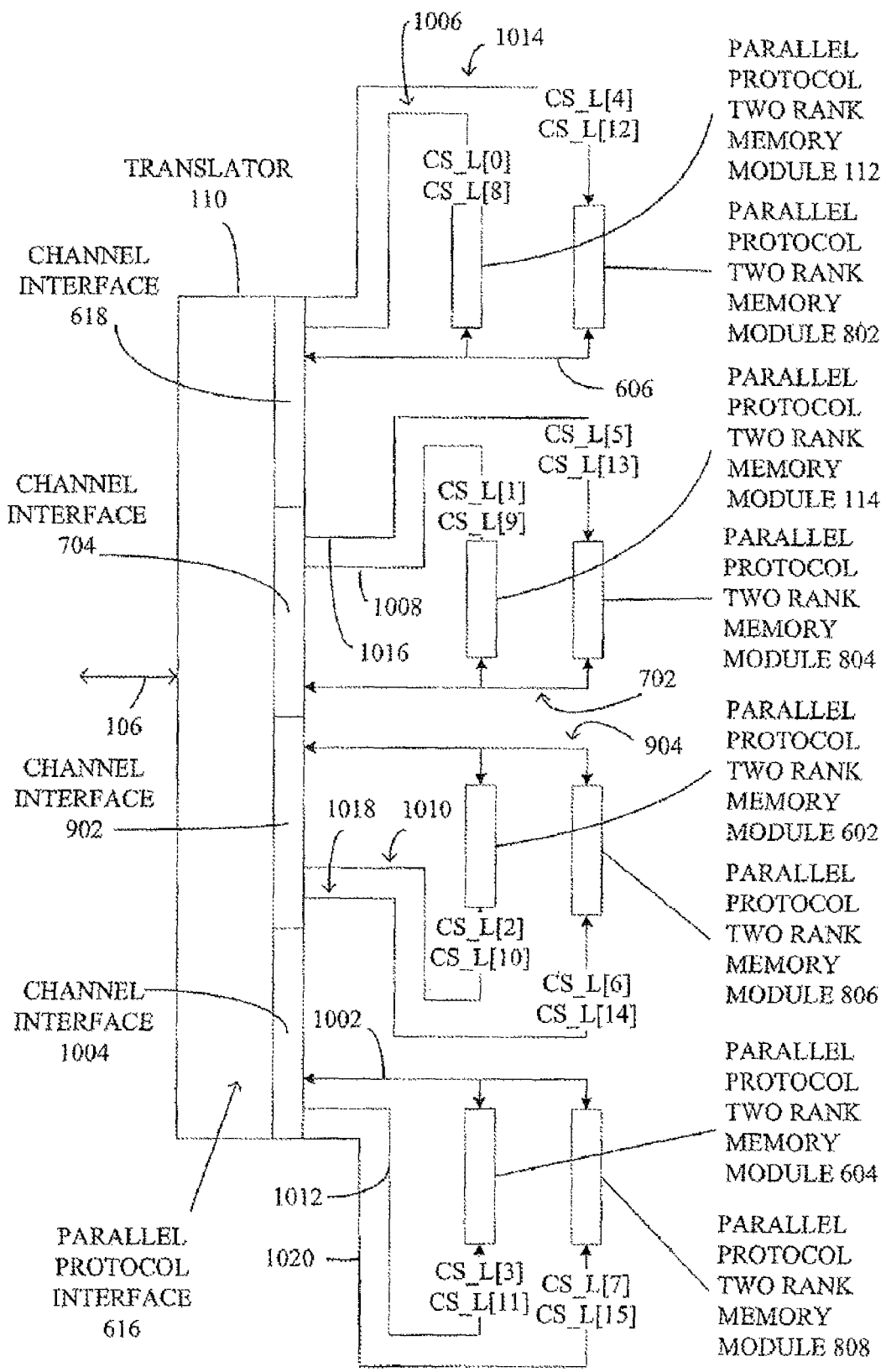
FIG. 10 is a representation of a translator and eight parallel protocol memory modules of an implementation of the apparatus of FIG. 1, and illustrates four exemplary channel interfaces of the translator.

Referring to FIG. 9, an exemplary implementation employs two-rank parallel memory modules as the parallel protocol memory modules 112, 114, 602, 604, 802, 804. The parallel protocol interface 616 of the translator 110 in an example comprises three channel interfaces, for example, channel interface 618, channel interface 704, and channel interface 902. The parallel protocol interface 616 in an example comprises three DDR channel outputs with four (4) ranks on each channel for a maximum number of twelve (12) ranks.

| DS2 | DS1 | DS0 | RS | Chip Select Logic Value |
|---|---|---|---|---|
| 0 | 0 | 0 | 0 | CS_L[0] |
| 0 | 0 | 0 | 1 | CS_L[1] |
| 0 | 0 | 1 | 0 | CS_L[2] |
| 0 | 0 | 1 | 1 | CS_L[3] |
| 0 | 1 | 0 | 0 | CS_L[4] |
| 0 | 1 | 0 | 1 | CS_L[5] |
| 0 | 1 | 1 | 0 | CS_L[6] |
| 0 | 1 | 1 | 1 | CS_L[7] |
| 1 | 0 | 0 | 0 | CS_L[8] |
| 1 | 0 | 0 | 1 | CS_L[9] |
| 1 | 0 | 1 | 0 | CS_L[10] |
| 1 | 0 | 1 | 1 | CS_L[11] |

The parallel protocol interface 616 of the translator 110 in an example applies particular Chip Select Logic Values zero (0) to eleven (11) to the control busses 906, 908, 910, 912, 914, 916 to select the corresponding ranks of parallel memory devices 122 in the parallel protocol memory modules 112, 114, 602, 604, 802, 804. An exemplary implementation employs an exemplary logical association and/or assignment in connection with the parallel protocol memory modules such as parallel protocol memory module 112 corresponds to logic value zero (0), parallel protocol memory module 114 corresponds to logic value one (1), parallel protocol memory module 602 (FIG. 6) corresponds to logic value two (2), parallel protocol memory module 604 (FIG. 6) corresponds to logic value three (3), parallel protocol memory module 802 corresponds to logic value four (4), and parallel protocol memory module 804 corresponds to logic value five (5).

The channel interface 618 in an example applies Chip Select Logic Values zero (0) and six (6) to the control bus 906 to select the respective two ranks of parallel memory devices 122 in an exemplary parallel protocol memory module 112. The channel interface 704 in an example applies Chip Select Logic Values one (1) and seven (7) to the control bus 908 to select the respective two ranks of parallel memory devices 122 in an exemplary parallel protocol memory module 114. The channel interface 902 in an example applies Chip Select Logic Values two (2) and eight (8) to the control bus 910 to select the respective two ranks of parallel memory devices 122 in an exemplary parallel protocol memory module 602. The channel interface 618 in an example applies Chip Select Logic Values three (3) and nine (9) to the control bus 912 to select the respective two ranks of parallel memory devices 122 in an exemplary parallel protocol memory module 604. The channel interface 704 in an example applies Chip Select Logic Values four (4) and ten (10) to the control bus 914 to select the respective two ranks of parallel memory devices 122 in an exemplary parallel protocol memory module 802. The channel interface 902 in an example applies Chip Select Logic Values five (5) and eleven (11) to the control bus 916 to select the respective two ranks of parallel memory devices 122 in an exemplary parallel protocol memory module 804.

Referring to FIG. 10, an exemplary implementation employs two-rank parallel memory modules as the parallel protocol memory modules 112, 114, 602, 604, 802, 804, 806, 808. The parallel protocol interface 616 of the translator 110 in an example comprises four channel interfaces, for example, channel interface 618, channel interface 704, channel interface 902, and channel interface 1004. The parallel protocol interface 616 in an example comprises four DDR channel outputs with four (4) ranks on each channel for a maximum number of sixteen (16) ranks. FIG. 10 in an example employ the same logic table as FIG. 8 but distributes the signals differently among the parallel protocol memory modules 112, 114, 602, 604, 802, 804, 806, 808.

| DS2 | DS1 | DS0 | RS | Chip Select Logic Value |
|---|---|---|---|---|
| 0 | 0 | 0 | 0 | CS_L[0] |
| 0 | 0 | 0 | 1 | CS_L[1] |
| 0 | 0 | 1 | 0 | CS_L[2] |
| 0 | 0 | 1 | 1 | CS_L[3] |
| 0 | 1 | 0 | 0 | CS_L[4] |
| 0 | 1 | 0 | 1 | CS_L[5] |
| 0 | 1 | 1 | 0 | CS_L[6] |
| 0 | 1 | 1 | 1 | CS_L[7] |
| 1 | 0 | 0 | 0 | CS_L[8] |
| 1 | 0 | 0 | 1 | CS_L[9] |
| 1 | 0 | 1 | 0 | CS_L[10] |
| 1 | 0 | 1 | 1 | CS_L[11] |
| 1 | 1 | 0 | 0 | CS_L[12] |
| 1 | 1 | 0 | 1 | CS_L[13] |
| 1 | 1 | 1 | 0 | CS_L[14] |
| 1 | 1 | 1 | 1 | CS_L[15] |

The parallel protocol interface 616 of the translator 110 in an example applies particular Chip Select Logic Values zero (0) to fifteen (15) to the control busses 1006, 1008, 1010, 1012, 1014, 1016, 1018, 1020 to select the corresponding ranks of parallel memory devices 122 in the parallel protocol memory modules 112, 114, 602, 604, 802, 804, 806, 808. An exemplary implementation employs an exemplary logical association and/or assignment in connection with the parallel protocol memory modules such as parallel protocol memory module 112 corresponds to logic value zero (0), parallel protocol memory module 114 corresponds to logic value one (1), parallel protocol memory module 602 corresponds to logic value two (2), parallel protocol memory module 604 corresponds to logic value three (3), parallel protocol memory module 802 corresponds to logic value four (4), parallel protocol memory module 804 corresponds to logic value five (5), parallel protocol memory module 806 corresponds to logic value six (6), and parallel protocol memory module 808 corresponds to logic value seven (7).

The channel interface 618 in an example applies Chip Select Logic Values zero (0) and eight (8) to the control bus 1006 to select the respective two ranks of parallel memory devices 122 in an exemplary parallel protocol memory module 112. The channel interface 704 in an example applies Chip Select Logic Values one (1) and nine (9) to the control bus 1008 to select the respective two ranks of parallel memory devices 122 in an exemplary parallel protocol memory module 114. The channel interface 902 in an example applies Chip Select Logic Values two (2) and ten (10) to the control bus 1010 to select the respective two ranks of parallel memory devices 122 in an exemplary parallel protocol memory module 602. The channel interface 1004 in an example applies Chip Select Logic Values three (3) and eleven (11) to the control bus 1012 to select the respective two ranks of parallel memory devices 122 in an exemplary parallel protocol memory module 604. The channel interface 618 in an example applies Chip Select Logic Values four (4) and twelve (12) to the control bus 1014 to select the respective two ranks of parallel memory devices 122 in an exemplary parallel protocol memory module 802. The channel interface 704 in an example applies Chip Select Logic Values five (5) and thirteen (13) to the control bus 1016 to select the respective two ranks of parallel memory devices 122 in an exemplary parallel protocol memory module 804. The channel interface 902 in an example applies Chip Select Logic Values six (6) and fourteen (14) to the control bus 1018 to select the respective two ranks of parallel memory devices 122 in an exemplary parallel protocol memory module 806. The channel interface 1004 in an example applies Chip Select Logic Values seven (7) and fifteen (15) to the control bus 1020 to select the respective two ranks of parallel memory devices 122 in an exemplary parallel protocol memory module 808.

Figure 11:
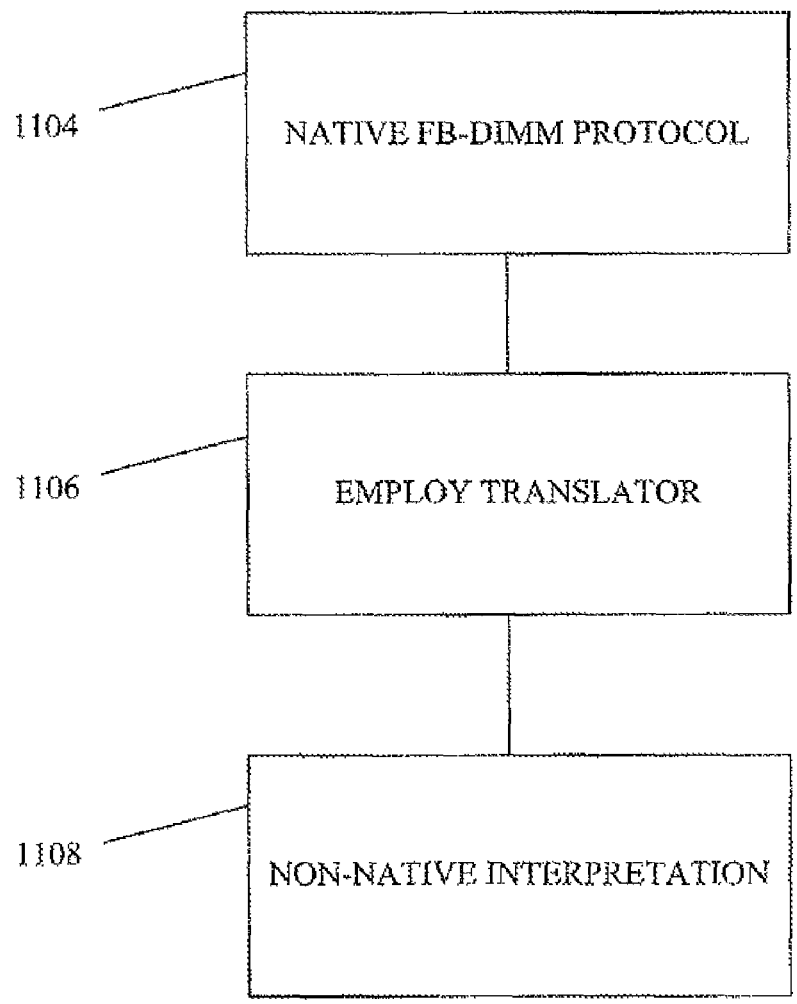
FIG. 11 is a representation of an exemplary logic flow for selection of ranks of parallel memory devices of the apparatus of FIG. 1.

An illustrative description of an exemplary operation of an implementation of the apparatus 100 is presented, for explanatory purposes. FIG. 11 is a representation of an exemplary logic flow 1102 for selection of ranks of parallel memory devices 122. The logic flow 1102 in an example is performed by a user, a consumer, an on-site service technician and/or provider, and/or an in-shop service technician and/or provider. STEP 1104 in an example proceeds to accommodate a native FB-DIMM protocol. STEP 1106 employs a translator 110. STEP 1108 applies a non-native interpretation to the native FB-DIMM protocol. The translator 110 in an example select one or more ranks of parallel memory devices 122 from a plurality of available ranks of parallel memory devices 122 in a plurality of double data rate registered and/or unbuffered dual in-line memory modules (DDR registered and/or unbuffered DIMMs) 112, 114, 602, 604, 802, 804, 806, 808.

An exemplary implementation comprises a translator 110 that selects one or more ranks of parallel memory devices 122 from a plurality of available ranks of parallel memory devices 122 in a plurality of double data rate registered and/or unbuffered dual in-line memory modules (DDR registered and/or unbuffered DIMMs) 112, 114, 602, 604, 802, 804, 806, 808 through employment of a native fully buffered dual in-line memory module protocol (native FB-DIMM protocol).

The translator 110 employs one or more select signals of a plurality of select signals received under the native FB-DIMM protocol to select the one or more ranks of parallel memory devices 122 from the plurality of available ranks of parallel memory devices 122 in the plurality of DDR registered and/or unbuffered DIMMs 112, 114, 602, 604, 802, 804, 806, 808. The native FB-DIMM protocol natively requires an advanced memory buffer (AMB) 130 that allows a selection of any of a maximum four native-ranks of parallel memory devices 122. The translator 110 is employable with the native FB-DIMM protocol to allow for a maximum per FB-DIMM channel of eight DDR DIMMs that each comprises two native-ranks of parallel memory devices 122. A single instance of the translator 110 substitutes for up to eight instances of the AMB 130.

The native FB-DIMM protocol would allow a selection of any of a maximum four ranks of parallel memory devices 122 on an FB-DIMM 128. The translator 110 employs one or more signals from a plurality of signals received under the native FB-DIMM protocol to allow selection of any of more than four ranks of parallel memory devices 122 from the plurality of available ranks of parallel memory devices 122 in the plurality of DDR registered and/or unbuffered DIMMs 112, 114, 602, 604, 802, 804, 806, 808. The native FB-DIMM protocol comprises an allowed-maximum of FB-DIMMs 128 per FB-DIMM channel. The translator 110 serves to address DDR registered and/or unbuffered DIMMs 112, 114, 602, 604, 802, 804, 806, 808 per FB-DIMM channel equal in number to the allowed-maximum of FB-DIMMs 128 per FB-DIMM channel.

The native FB-DIMM protocol allows for a maximum per FB-DIMM channel of eight FB-DIMMs 128 that each comprises two ranks of parallel memory devices 122. The translator 110 serves to address up to sixteen ranks of parallel memory devices 122 from the plurality of available ranks of parallel memory devices 122 in the plurality of DDR registered and/or unbuffered DIMMs 112, 114, 602, 604, 802, 804, 806, 808. The native FB DIMM protocol comprises DIMM select binary digits (bits DS0 to DS2) and rank select binary digit (bit RS). The translator 110 employs the bits RS and DS0 to DS2 of the native FB DIMM protocol to select the one or more ranks of parallel memory devices 122 from the plurality of available ranks of parallel memory devices 122 in the plurality of DDR registered DIMMs 112, 114, 602, 604, 802, 804, 806, 808.

The plurality of available ranks of parallel memory devices 122 comprises eight ranks of parallel memory devices 122. The plurality of DDR registered and/or unbuffered DIMMs 112, 114, 602, 604, 802, 804, 806, 808 comprises four DDR registered and/or unbuffered DIMMs 112, 114, 602, 604. The native FB DIMM protocol comprises DIMM select bits (bits DS0 to DS2) and rank select bit (bit RS). The translator 110 interprets the bits RS and DS0 to DS2 of the native FB DIMM protocol to select any corresponding rank of the eight ranks of parallel memory devices 122 in the four DDR registered and/or unbuffered DIMMs 112, 114, 602, 604. The translator 110 comprises a one-channel interface that employs the bits RS and DS0 to DS2 of the native FB DIMM protocol to select the any corresponding rank of the eight ranks of parallel memory devices 122 in the four DDR registered and/or unbuffered DIMMs 112, 114, 602, 604.

The plurality of available ranks of parallel memory devices 122 comprises sixteen ranks of parallel memory devices 122. The plurality of DDR registered and/or unbuffered DIMMs 112, 114, 602, 604, 802, 804, 806, 808 comprises four DDR registered and/or unbuffered DIMMs 112, 114, 602, 604. The native FB DIMM protocol comprises DIMM select bits (bits DS0 to DS2) and rank select bit (bit RS). The translator 110 interprets the bits RS and DS0 to DS2 of the native FB DIMM protocol to select any corresponding rank of the sixteen ranks of parallel memory devices 122 in the four DDR registered and/or unbuffered DIMMs 112, 114, 602, 604. The translator 110 comprises a two-channel interface that employs the bits RS and DS0 to DS2 of the native FB DIMM protocol to select the any corresponding rank of the sixteen ranks of parallel memory devices 122 in the four DDR registered and/or unbuffered DIMMs 112, 114, 602, 604.

The plurality of available ranks of parallel memory devices 122 comprises sixteen ranks of parallel memory devices 122. The plurality of DDR registered and/or unbuffered DIMMs 112, 114, 602, 604, 802, 804, 806, 808 comprises eight DDR registered and/or unbuffered DIMMs 112, 114, 602, 604, 802, 804, 806, 808. The native FB DIMM protocol comprises DIMM select bits (bits DS0 to DS2) and rank select bit (bit RS). The translator 110 interprets the bits RS and DS0 to DS2 of the native FB DIMM protocol to select any corresponding rank of the sixteen ranks of parallel memory devices 122 in the eight DDR registered and/or unbuffered DIMMs 112, 114, 602, 604, 802, 804, 806, 808. The translator 110 comprises a two-channel interface that employs the bits RS and DS0 to DS2 of the native FB DIMM protocol to select the any corresponding rank of the sixteen ranks of parallel memory devices 122 in the eight DDR registered and/or unbuffered DIMMs 112, 114, 602, 604, 802, 804; 806, 808. The translator 110 comprises a four-channel interface that employs the bits RS and DS0 to DS2 of the native FB DIMM protocol to select the any corresponding rank of the sixteen ranks of parallel memory devices 122 in the eight DDR registered and/or unbuffered DIMMs 112, 114, 602, 604, 802, 804, 806, 808.

The plurality of available ranks of parallel memory devices 122 comprises twelve ranks of parallel memory devices 122. The plurality of DDR registered and/or unbuffered DIMMs 112, 114, 602, 604, 802, 804, 806, 808 comprises six DDR registered and/or unbuffered DIMMs 112, 114, 602, 604, 802, 804. The native FB DIMM protocol comprises DIMM select bits (bits DS0 to DS2) and rank select bit (bit RS). The translator 110 interprets the bits RS and DS0 to DS2 of the native FB DIMM protocol to select any corresponding rank of the twelve ranks of parallel memory devices 122 in the six DDR registered and/or unbuffered DIMMs 112, 114, 602, 604, 802, 804. The translator 110 comprises a three-channel interface that employs the bits RS and DS0 to DS2 of the native FB DIMM protocol to select the any corresponding rank of the twelve ranks of parallel memory devices 122 in the six DDR registered and/or unbuffered DIMMs 112, 114, 602, 604, 802, 804.

An exemplary implementation comprises a translator 110 that selects one or more ranks of parallel memory devices 122 from a plurality of available ranks of parallel memory devices 122 in a plurality of double data rate registered and/or unbuffered dual in-line memory modules (DDR registered and/or unbuffered DIMMs) 112, 114, 602, 604, 802, 804, 806, 808 through employment of DIMM select binary digits (bits DS0 to DS2) and rank select binary digit (bit RS) of a native fully buffered dual in-line memory module protocol (native FB-DIMM protocol).

The native FB-DIMM protocol natively requires an advanced memory buffer (AMB) 130 that allows a selection of any of a maximum four native-ranks of parallel memory devices 122. The translator 110 is employable with the native FB-DIMM protocol to allow for a maximum per FB-DIMM channel of eight DDR DIMMs that each comprises two native-ranks of parallel memory devices 122. A single instance of the translator 110 substitutes for up to eight instances of the AMB 130.

An exemplary approach applies a non-native interpretation to a native fully buffered dual in-line memory module protocol (native FB-DIMM protocol) to select one or more ranks of parallel memory devices 122 from a plurality of available ranks of parallel memory devices 122 in a plurality of double, data rate registered and/or unbuffered dual in-line memory modules (DDR registered and/or unbuffered DIMMs) 112, 114, 602, 604, 802, 804, 806, 808.

The native FB-DIMM protocol natively requires an advanced memory buffer (AMB) 130 that allows a selection of any of a maximum four native-ranks of parallel memory devices 122. The translator 110 is employed with the native FB-DIMM protocol to allow for a maximum per FB-DIMM channel of eight DDR DIMMs that each comprises two native-ranks of parallel memory devices 122. A single instance of the translator 110 is employed in place of up to eight instances of the AMB 130.

An implementation of the apparatus 100 in an example comprises a plurality of components such as one or more of electronic components, chemical components, organic components, mechanical components, hardware components, optical components, and/or computer software components. A number of such components can be combined or divided in an implementation of the apparatus 100. In one or more exemplary implementations, one or more features described herein in connection with one or more components and/or one or more parts thereof are applicable and/or extendible analogously to one or more other instances of the particular component and/or other components in the apparatus 100. In one or more exemplary implementations, one or more features described herein in connection with one or more components and/or one or more parts thereof may be omitted from or modified in one or more other instances of the particular component and/or other components in the apparatus 100. An exemplary technical effect is one or more exemplary and/or desirable functions, approaches, and/or procedures. An exemplary component of an implementation of the apparatus 100 employs and/or comprises a set and/or series of computer instructions written in or implemented with any of a number of programming languages, as will be appreciated by those skilled in the art. An implementation of the apparatus 100 in an example comprises any (e.g., horizontal, oblique, or vertical) orientation, with the description and figures herein illustrating an exemplary orientation of an exemplary implementation of the apparatus 100, for explanatory purposes.

An implementation of the apparatus 100 in an example encompasses an article. The article comprises one or more computer-readable signal-bearing media. The article comprises means in the one or more media for one or more exemplary and/or desirable functions, approaches, and/or procedures.

An implementation of the apparatus 100 in an example employs one or more computer readable signal bearing media. A computer-readable signal-bearing medium in an example stores software, firmware and/or assembly language for performing one or more portions of one or more implementations. An example of a computer-readable signal bearing medium for an implementation of the apparatus 100 comprises a memory and/or recordable data storage medium of the riser card 102 and/or PCB 104. A computer-readable signal-bearing medium for an implementation of the apparatus 100 in an example comprises one or more of a magnetic, electrical, optical, biological, chemical, and/or atomic data storage medium. For example, an implementation of the computer-readable signal-bearing medium comprises one or more floppy disks, magnetic tapes, CDs, DVDs, hard disk drives, and/or electronic memory. In another example, an implementation of the computer-readable signal-bearing medium comprises a modulated carrier signal transmitted over a network comprising or coupled with an implementation of the apparatus 100, for instance, one or more of a telephone network, a local area network ("LAN"), a wide area network ("WAN"), the Internet, and/or a wireless network.

The steps or operations described herein are examples. There may be variations to these steps or operations without departing from the spirit of the invention. For example, the steps may be performed in a differing order, or steps may be added, deleted, or modified.

Although exemplary implementation of the invention has been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A system comprising a translator circuit for translating a memory access conforming to a native FB-DIMM (Fully Buffered Dual In-Line Memory Module) protocol to a memory access for addressing more than two ranks of parallel memory devices distributed among plural non-fully-buffered DIMMs (Dual In-Line Memory Modules) by converting at least one FB-DIMM-select bit of said FB-DIMM protocol for use as a rank-select bit.

2. A system as recited in claim 1 wherein said non-fully-buffered DIMMs are registered DIMMs.

3. A system as recited in claim 1 wherein said non-fully-buffered DIMMs are unbuffered DIMMs.

4. A system as recited in claim 1 further comprising:
a memory controller for issuing said memory access; and
said non-fully-buffered DIMMs.

5. A system as recited in claim 1 wherein said converting involves using as rank select bits one or more bits assigned in said native FB-DIMM protocol for selecting FB-DIMMs.

6. A system as recited in claim 5 wherein said converting involves using as rank select bits all bits assigned in said native FB-DIMM protocol for selecting FB-DIMMs so as to provide for selecting among sixteen ranks.

7. A memory access method comprising:
issuing a memory access conforming to a native FB-DIMM (Fully Buffered Dual In-Line Memory Module) protocol, said memory access having at least one FB-DIMM-select bit for specifying an FB-DIMM and at least one rank-select bit specifying a rank within a selected FB-DIMM;
converting said memory access so that at least one FB-DIMM-select bit is used with said rank-select bit to select a rank from a set of more than two ranks associated with non-fully-buffered DIMMs.

8. A method as recited in claim 7 wherein said non-fully-buffered DIMMs are registered DIMMs.

9. A method as recited in claim 7 wherein said non-fully-buffered DIMMs are unbuffered DIMMs.

10. A method as recited in claim 7 wherein said converting involves using all FB-DIMM-select bits provided for in said FB-DIMM protocol to provide for selecting from a set of sixteen ranks associated with non-fully-buffered DIMMs.

* * * * *